(12) United States Patent
Byun

(10) Patent No.: US 10,152,114 B2
(45) Date of Patent: Dec. 11, 2018

(54) MEMORY MODULE MONITORING MEMORY OPERATION AND POWER MANAGEMENT METHOD THEREOF

(71) Applicant: SAMSUNG ELECTRONICS CO., LTD., Suwon-si, Gyeonggi-Do (KR)

(72) Inventor: Hui-Chung Byun, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 108 days.

(21) Appl. No.: 15/223,568

(22) Filed: Jul. 29, 2016

(65) Prior Publication Data

US 2017/0115915 A1 Apr. 27, 2017

(30) Foreign Application Priority Data

Oct. 22, 2015 (KR) .................. 10-2015-0147518

(51) Int. Cl.
| | |
|---|---|
| G06F 1/00 | (2006.01) |
| G06F 1/32 | (2006.01) |
| G11C 5/14 | (2006.01) |
| G11C 11/4074 | (2006.01) |
| G11C 29/02 | (2006.01) |
| G11C 29/08 | (2006.01) |
| G11C 29/20 | (2006.01) |
| G11C 29/50 | (2006.01) |

(52) U.S. Cl.
CPC ............ *G06F 1/3296* (2013.01); *G06F 1/324* (2013.01); *G06F 1/3206* (2013.01); *G06F 1/3275* (2013.01); *G11C 5/14* (2013.01); *G11C 11/4074* (2013.01); *G11C 29/021* (2013.01); *G11C 29/022* (2013.01); *G11C 29/023* (2013.01); *G11C 29/028* (2013.01); *G11C 29/08* (2013.01); *G11C 29/20* (2013.01); *G11C 2029/5002* (2013.01); *G11C 2029/5004* (2013.01); *Y02D 10/126* (2018.01); *Y02D 10/14* (2018.01); *Y02D 10/172* (2018.01)

(58) Field of Classification Search
CPC ...... G06F 1/3296; G06F 1/3206; G06F 1/324; G06F 1/3275; G11C 5/14; G11C 11/4074; G11C 29/021; G11C 29/022
USPC ................. 713/300, 322, 193; 711/103, 755; 718/102
See application file for complete search history.

(56) References Cited

U.S. PATENT DOCUMENTS

| | | | |
|---|---|---|---|
| 6,473,814 B1 * | 10/2002 | Lyons ..................... | G06F 13/28 710/33 |
| 7,412,614 B2 | 8/2008 | Ku | |
| 8,438,410 B2 | 5/2013 | David et al. | |
| 8,909,957 B2 | 12/2014 | Kolvick et al. | |
| 2007/0162554 A1 * | 7/2007 | Branda .................. | H04L 51/04 709/207 |
| 2008/0228959 A1 * | 9/2008 | Wang ...................... | G06F 1/206 710/22 |

(Continued)

*Primary Examiner* — Aurel Prifti
(74) *Attorney, Agent, or Firm* — F. Chau & Associates, LLC

(57) ABSTRACT

A memory module includes a counter configured to count a number of commands received from a host to generate a counted number and provide the counted value to the host, a memory device configured to receive an operating frequency and an operating voltage from that host that are determined based on the counted number, and a serial presence detect (SPD) configured to store the operating frequency and operating voltage.

15 Claims, 16 Drawing Sheets

(56) References Cited

U.S. PATENT DOCUMENTS

| | | | |
|---|---|---|---|
| 2010/0202475 A1* | 8/2010 | Nakazumi | H04L 12/42 |
| | | | 370/475 |
| 2010/0250981 A1 | 9/2010 | Pamley et al. | |
| 2010/0325349 A1* | 12/2010 | Otsuka | G06F 12/0246 |
| | | | 711/103 |
| 2011/0022870 A1 | 1/2011 | McGrane et al. | |
| 2011/0179421 A1* | 7/2011 | Gustafsson | G06F 1/3203 |
| | | | 718/102 |
| 2012/0011301 A1* | 1/2012 | Goss | G11C 16/10 |
| | | | 711/103 |
| 2012/0066439 A1* | 3/2012 | Fillingim | G06F 11/3485 |
| | | | 711/103 |
| 2013/0054949 A1 | 2/2013 | Berke et al. | |
| 2013/0262894 A1* | 10/2013 | Lee | G06F 1/324 |
| | | | 713/322 |
| 2014/0281594 A1* | 9/2014 | Yang | G06F 1/26 |
| | | | 713/300 |
| 2014/0301152 A1 | 10/2014 | Cox et al. | |
| 2015/0095620 A1* | 4/2015 | Ananthakrishnan | |
| | | | G06F 9/30083 |
| | | | 712/220 |
| 2015/0242141 A1* | 8/2015 | Kuo | G06F 11/00 |
| | | | 713/193 |
| 2015/0256203 A1* | 9/2015 | Yamazaki | H03M 13/29 |
| | | | 714/755 |
| 2016/0004294 A1* | 1/2016 | Stenfort | G06F 1/3268 |
| | | | 713/310 |
| 2016/0313941 A1* | 10/2016 | Suzuki | G06F 3/0625 |
| 2016/0350179 A1* | 12/2016 | Lin | G11C 29/52 |
| 2017/0262208 A1* | 9/2017 | Chooi | G06F 3/0625 |

\* cited by examiner

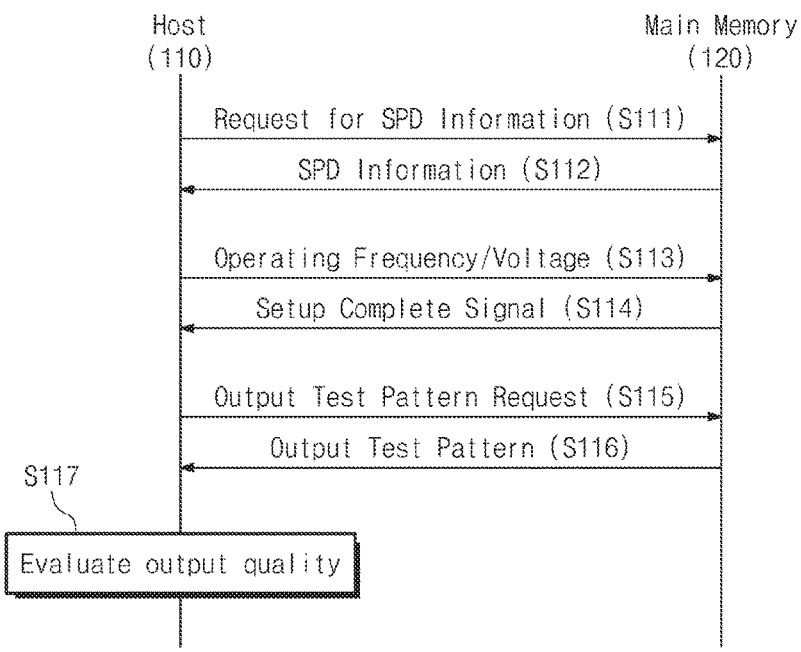

MEMORY MODULE MONITORING MEMORY OPERATION AND POWER MANAGEMENT METHOD THEREOF

CROSS-REFERENCE TO RELATED APPLICATIONS

This US non-provisional patent application claims priority under 35 USC § 119 to Korean Patent Application No. 10-2015-0147518, filed on Oct. 22, 2015, the disclosure of which is incorporated by reference in its entirety herein.

BACKGROUND

1. Technical Field

The present disclosure relates to semiconductor devices and, more particularly, to a memory module and a power management method thereof.

2. Discussion of Related Art

In computing, a server is a device that provides functionality for other programs or devices, called clients. This architecture is called the client-server model. Servers can provide various functionalities, often called "services", such as sharing data or resources among multiple clients, or performing computation for a client. However, servers and other electronic systems may consume a great deal of energy.

The operating frequency and the operating voltage of a memory used in a smartphone may be adjusted so that the smartphone uses less energy. However, a memory used in a current server system cannot change an operating frequency and an operating voltage during an operation.

SUMMARY

At least one embodiment of the inventive concept relates to a method for improving power efficiency in a server system.

A memory module according to an exemplary embodiment of the inventive concept includes a memory device, a counter, and a serial presence detect (SPD). The counter counts the number of commands received from a host to generate a counted number and provides the counted value to the host. The memory device is configured receive an operating frequency and an operating voltage from the host that are determined based on the counted number. The SPD may stores about the received operating frequency and operating voltage.

A method of managing a main memory according to an exemplary embodiment of the inventive concept includes calculating a peak bandwidth of the main memory in synchronization with an operation flag, determining an operating frequency and an operating voltage of the main memory so that the operating frequency of the main memory is higher than the peak bandwidth, and storing the determined operating frequency and the determined operating voltage in a serial presence detect (SPD) of the main memory.

A server according to an exemplary embodiment of the inventive concept includes a host computer and a main memory. The host computer stores a plurality of entries, where each entry includes a different operating frequency and an operating voltage pair. The main memory includes a serial presence detect (SPD). The host computer determines a memory bandwidth of the main memory, selects one of the entries that corresponds to the determined memory bandwidth, and transmits the operating frequency and the operating voltage of the selected one entry to the SPD.

BRIEF DESCRIPTION OF THE DRAWINGS

Exemplary embodiments of the inventive concept will be more clearly understood from the following detailed description taken in conjunction with the accompanying drawings in which:

FIG. 3 is a flowchart illustrating an interaction of a host and a main memory;

FIG. 4 illustrates exemplary operating frequency and operating voltage combinations of a main memory according to an exemplary embodiment of the inventive concept;

DETAILED DESCRIPTION

Figure 1:
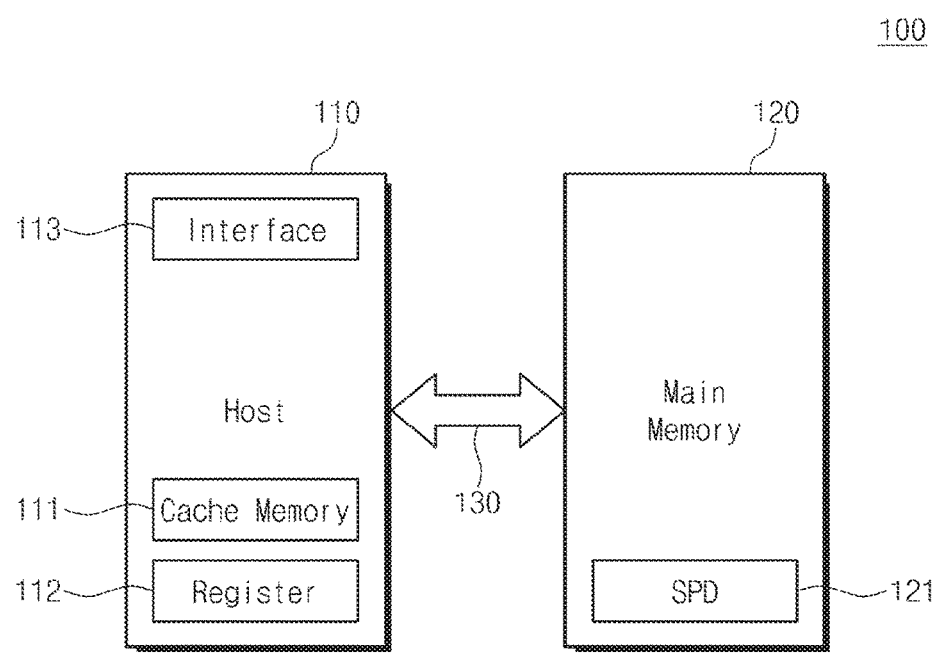
FIG. 1 is a block diagram of a data processing device according to an exemplary embodiment of the inventive concept.

Embodiments of the inventive concept will now be described more fully hereinafter with reference to the accompanying drawings, in which exemplary embodiments are shown. The inventive concept may, however, be embodied in many different forms and should not be construed as being limited to the exemplary embodiments set forth herein. Rather, these exemplary embodiments are provided so that this disclosure will be thorough and complete, and will fully convey the scope of the inventive concept to those of ordinary skill in the art. In the drawings, the thicknesses of layers and regions may be exaggerated for clarity. Like reference characters and/or numerals in the drawings denote like elements, and thus their description may be omitted.

FIG. 1 is a block diagram of a data processing device according to an exemplary embodiment of the inventive concept. As illustrated, the data processing device 100 includes a host 110 and a main memory 120.

The host 110 includes a cache memory 111, a register 112, and an interface 113. The host 110 is connected to the main memory 120 through a data bus line 130. In an embodiment, a latency of the cache memory 111 is lower than a latency of the main memory 120. In an embodiment, a size of the cache memory 111 is smaller than a size of the main memory 120.

The host 110 may access the cache memory 111 during a data processing operation before accessing the main memory 120. In this case, the host 110 transmits an address and a control command to the cache memory 111. The host 110 performs an operation depending on a cache hit when desired data or command of the host 110 is present in the cache memory 111. For example, a cache hit occurs when the desired data or the command is present in the cache memory 111.

During the cache hit, target data output from the cache memory 111 is transmitted to the host 110. In an exemplary embodiment, the host 110 accesses the cache memory 111 before accessing the main memory 120 when frequently used partial data of the main memory 120 is temporarily stored in the cache memory 111 by the host 110.

Meanwhile, the host 110 performs an operation depending on a cache miss when desired data or a command of the host 110 is not present in the cache memory 111. For example, a cache miss occurs when the data or the command is not present in the cache memory 111. In an embodiment, the host 110 controls the main memory 120 through the data bus line 130. Thus, data output from the main memory 120 is transmitted to the host 110 through the bus line 130. In an embodiment, when accessing the main memory 120, the host 110 exchanges a clock signal, data, and command information for data input/output with the main memory 120.

In association with an operation of the cache memory 111, a cache miss ratio may be defined as a ratio of the number of cache misses to the total number of accesses of the host 110 to a memory. The number of memory accesses may be defined as the total number of accesses to the memory to read data and commands required to execute a program by the host 110. The number of cache misses may be defined as the number of attempted memory accesses by the host 110 where information required by a central processing unit (CPU) of the host 110 is not found in the cache memory 111. The below Equation (1) indicates that the Cache Miss Ratio is defined as the Number of Cache Misses divided by the number of Memory Accesses.

$$\text{Cache Miss Ratio} = \text{Number of Cache Misses}/\text{Number of Memory Accesses} \quad \text{Equation (1)}$$

The higher a cache miss ratio, the more the number of accesses of the host 110 to the main memory 120 increases. Therefore, access time is increased and execution efficiency is reduced. Since a cache miss ratio is in proportion to a ratio of access to the main memory 120 of the host 110, operating speed of the main memory 120 may be calculated by monitoring the cache miss ratio. At least one embodiment of the inventive concept provides a power management method of the main memory 120 using a cache miss ratio and this will be described in detail later with reference to accompanying drawings. In an alternate embodiment, a cache miss ratio is a ratio of the number of cache misses to the total number of accesses of the cache.

The register 112 stores a result obtained by an operation of the host 110. In an embodiment, the register 112 stores a combination of an operating frequency and an operating voltage of the main memory 120 that is determined during booting of the host 110.

The interface 113 is a block (e.g., circuit) through which data exchanged between the host 110 and the main memory 120 may pass last in the host 110. That is, the interface 113 may serve as a data buffer. In an embodiment, the interface 113 performs leveling and training during booting of the data processing device 100 to optimize the quality of the data exchanged between the host 110 and the main memory 120. Thus, the interface 113 may change an operation environment of the host 110.

The main memory 120 includes a serial presence detect (SPD) 121. The main memory 120 exchanges a clock signal, a command, and data with the host 110 according to a command of the host 110. The SPD 121 has information on a voltage and a clock period of the main memory 120. The SPD 121 provides or stores SPD information according to a request of the host 110. The detailed configuration of the memory 120 will be described in detail later with reference to accompanying drawings. In an embodiment, the SPD 121 may be accessed by an external source (e.g., a basic input/output system (BIOS), the host 110, etc.) to inform the source of at least one of the size, data width, operating speed, operating frequency, operating voltage, latency, number of banks, interface voltage level, refresh requirements, clock cycle time, access time, and operating bandwidth of the memory 120.

In an exemplary embodiment, the operating bandwidth of the main memory 120 is defined as the actual data transmission speed of the main memory 120 controlled by a command of the host 110.

In an exemplary embodiment, the operating frequency of the main memory 120 is defined by a clock period provided to the main memory 120 from the host 110.

The tendency of a workload that may appear in the data processing device 100 includes two tendencies such as a memory concentration tendency and a host concentration tendency. When the workload of the data processing device 100 is in the memory concentration tendency, an increase in memory bandwidth allows the overall system performance to be improved. Memory bandwidth of a memory may be the rate at which data can be read from or stored to the memory. However, when the workload of the data processing data 100 is in the host concentration tendency, the overall system performance is typically not improved even when the memory bandwidth is increased.

A server system has a service-oriented workload. For this reason, a workload of the server system is determined according to the type of provided service and is typically fixed. That is, the workload may be estimated after the provided service is determined. Accordingly, when it is possible to determine a workload of a server system, the data processing device 100 may change an operating frequency and an operating voltage of the main memory 120 to values that are suitable for processing the workload. As a result, the data processing device 100 may efficiently manage power of the server system.

Figure 2:
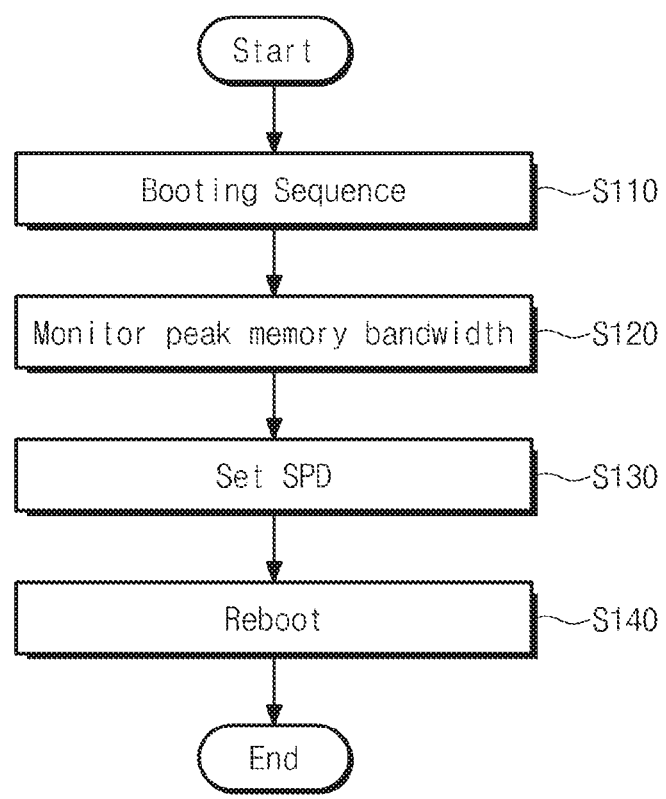
FIG. 2 is a flowchart of a method of operating a main memory according to an exemplary embodiment of the inventive concept.

FIG. 2 is a flowchart of a method for determining a combination of an operating frequency and an operating voltage of the main memory according to an exemplary embodiment of the inventive concept. A method for setting an operating frequency and an operating voltage of the main memory 120 according to characteristics of a workload will be now be described with reference to FIGS. 1 and 2.

At S110, power is supplied or a reset procedure is performed to drive the data processing device 100. The reset procedure may include performing one or more booting sequences and the reset procedure may be performed when power is supplied to the data processing device 110. The host 110 may set an operating frequency and an operating voltage of the main memory 120 during one of the booting sequences. For example, a power-on self-test (POST) that is one of the booting sequences may include an operation of testing the main memory 120. During the operation of testing the main memory 120, the host 110 may read the SPD 121 of the main memory 120. The host 110 may set the main memory 120 to an operation frequency and an operating voltage specified in the SPD 121.

At S120, the host 110 monitors the maximum operating bandwidth (hereinafter referred to as "peak bandwidth") of the main memory 120 using operation characteristics of the host 110 and the main memory 120. For example, the host 110 may determine a current workload based on the peak bandwidth.

At S130, the host 110 performs an SPD setup operation suitable for a workload using the peak bandwidth of the main memory 120. For example, the host 110 may select an operating frequency and an operating voltage that is suitable for the current workload and then update the current operating frequency and operating voltage of the SPD 121 using the selected operating frequency and operating voltage.

At S140, the main memory 120 is rebooted under operating frequency and operating voltage conditions of the main memory 120 set by the SPD 121. For example, after the main memory 120 is rebooted, the host 110 will access the main memory 120 using the updated operating frequency and updated operating voltage.

Hereinafter, each of the S110 to S140 will be described in detail.

FIG. 3 is a flowchart illustrating an interaction of the host and the main memory which may occur at S110 in FIG. 2. Referring to FIG. 3, the host 110 sets an operating frequency and an operating voltage based on information stored in the SPD 121 of the main memory 120.

At S111, the host 110 requests SPD information located in the SPD 121 from the main memory 120 during a booting procedure of the data processing device 100.

At S112, the main memory 120 provides the SPD information to the host 110 in response to the request of the host 110.

At S113, the host 110 sets the operating frequency and the operating voltage of the main memory 120 according to the received SPD information. In an embodiment, setting the operating frequency and the operating voltage of the main memory 120 includes writing a new operating frequency and a new operating voltage to the SPD 121 and rebooting the main memory 120.

At S114, the main memory 120 provides a complete signal to the host 110 when the setup of the operating frequency and the operating voltage has completed. The complete signal indicates to the host 110 that the operating frequency and the operating voltage of the main memory 120 have been set.

At S115, the host 110 outputs a request to the main memory 120 for a test pattern. For example, the host 110 outputs a request to the main memory 1120 for the test pattern in response to receiving the complete signal.

At S116, the main memory 120 outputs the test pattern to the host 110 in response to the request from the host 110.

At S117, the host 110 evaluates the output quality of the test output pattern. The host 110 sets a receiver voltage and sampling timing of the interface 113 so that the main memory 120 has optimal output characteristics through leveling and training.

When the output quality does not satisfy a reference quality, the host 110 changes an operating voltage of the main memory 120 to reevaluate the output quality of the main memory 120. However, when the output quality value satisfies the reference quality, the operating frequency and the operating voltage of the memory 120 at this point are stored in the register 112 of the host 110.

In an exemplary embodiment, the output quality of the test pattern is evaluated using a rank margin tool (RMT) value. In an exemplary embodiment, the reference quality is based on an INTEL guideline.

In an embodiment, the combination of the operating frequency and the operating voltage of the main memory 120 is repeatedly set until the operating frequency of the main memory 120 is made greater than or equal to a predetermined value N. In an exemplary embodiment, the predetermined value N is a peak operating frequency at which the main memory 120 operates. For example, the operating frequency and the operating voltage of the main memory 120 may be gradually adjusted in periodic steps until they reached the desired target values.

FIG. 4 illustrates an example of a combination of an operating frequency and an operating voltage that a main memory may provide. For example, after booting of the data processing device 100 has first completed, the data processing device 100 is rebooted a second time by setting the main memory 120 to 1333 Mbps, which is the lowest operating bandwidth. The host 110 evaluates the output quality of the main memory 120 while increasing an operating voltage of the main memory 120 from a lowest voltage. As a result, a voltage of 1.1 volt that is a lowest operating voltage of the main memory 120 for 1333 Mbps is found. A register 112 of the host 110 stores a clock period and an operating voltage at this point as a Combination 1. The host 110 increases the operating frequency of the main memory 120 to 1600 Mbps and repeats the same procedures. The register 112 of the host 110 finds the voltage of 1.1 volt that is the lowest operating voltage at this point and stores the voltage of 1.1 volts as a Combination 2. The host 110 repeats the same procedure until it reaches 2133 Mbps, which is a peak frequency at which the main memory 120 operates.

Hereinafter, an example of monitoring peak bandwidth of the main memory 120 after booting of the data processing device 100 has completed will now be described in detail with reference to FIG. 5.

Figure 5:
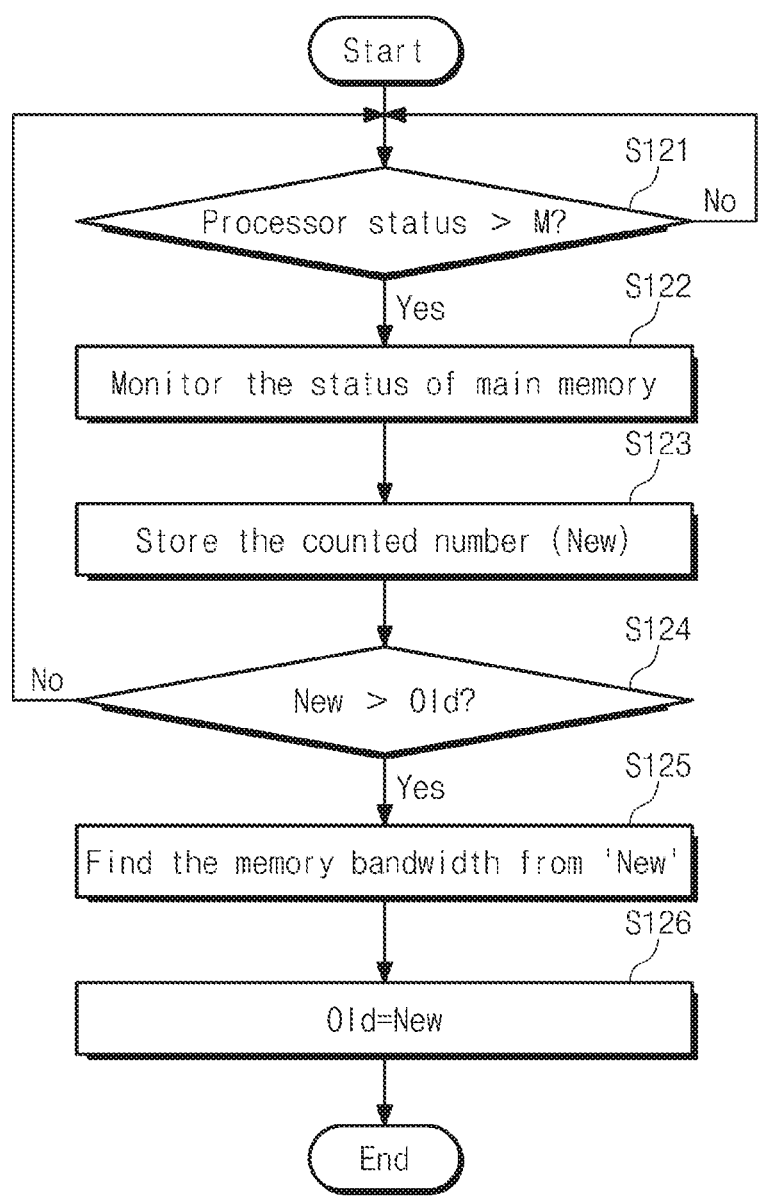
FIG. 5 is a flowchart illustrating a method that can be used to implement a S120 of FIG. 2 according to an exemplary embodiment of the inventive concept.

FIG. 5 is a flowchart illustrating a method for monitoring peak bandwidth of the main memory described at S120 in FIG. 2. Referring to FIG. 5, the peak bandwidth of the main memory 120 may be detected by the host 110.

At S121, the host 110 monitors an operating characteristic of the host 110 and compares the operating characteristic with a specific value M. When the operating characteristic is smaller than or equal to the specific value M (No direction), the host 110 continues to monitor the operating characteristic of the host 110. However, when the operating characteristic is greater than the specific value M (Yes direction), the flow proceeds to S122. A point of time to monitor the operation of the host 110 is selected. This is because it is more efficient to monitor the bandwidth of the main memory 120 at an interval where the operation characteristic of the host 110 is high. This is also aimed to reduce the cost wasted when the host 110 monitors the operation characteristic at all operation times. In an exemplary embodiment, the host 110 monitors the operation characteristic during only part of a given period and performs this monitoring periodically. In an exemplary embodiment, the operation characteristic of the host 110 is a CPU use rate. The term "CPU use rate" is defined as the amount of time for which a computer program occupies a CPU to perform work. For example, if a CPU of the host 110 is being used to execute one or more tasks for 80 ms of a sampled 100 ms period and is idle for 20 ms of the sampled period, its CPU use rate could be considered 80 percent. In an exemplary embodiment, when the operation characteristic of the host 110 is a CPU use rate, the specific value M is 80 percent.

At S122, the host 110 monitors the operation characteristic of the main memory 120. A counter 124 of the host 110 counts the operation characteristic of the main memory 120 to generate a new counted number. In an embodiment, the operation characteristic of the main memory 120 is a characteristic that represents a bandwidth of the main memory 120.

At S123, the register 112 of the host 110 stores a counted value (New) output at S122. For example, the new counted value may be a number of bits of data and/or commands written to and read from the main memory 120 during a given period of time.

At S124, a comparator of the host 110 compares the new counted value (New) with a previous counted value (Old). When the new counted value (New) is smaller than the previously counted value (Old) (No direction), the flow returns to S121 at which the host 110 re-monitors the operation characteristic of the host 110 because the current bandwidth of the main memory 120 is not a maximum bandwidth. When the new counted value (New) is greater than the previously counted value (Old), the host 110 performs the next step. At this point, the new counted value (New) may represent peak bandwidth of the value monitored until now.

At S125, the host 110 calculates a bandwidth of the main memory 120 from the new counted value (New). The bandwidth of the main memory 120 may be calculated in a manner that varies depending on the operation characteristic of the main memory 120.

In an exemplary embodiment, the operation characteristic of the main memory 120 is the number of commands exchanged between the host 110 and the main memory 120. For example, it is assumed that burst length of the main memory 120 is 1 and the number of read commands input to the main memory 120 for one second is 10. Under the assumption, the main memory 120 outputs 10 bits of data for one second. Thus, the bandwidth of the main memory 120 is calculated as 10 bps.

In an exemplary embodiment, the operation characteristic of the main memory 120 is the number of data bits exchanged between the host 110 and the main memory 120. For example, it is assumed that the number of data bits exchanged between the host 110 and the main memory 120 for one second is 10. Under the assumption, the bandwidth of the main memory 120 is calculated as 10 bps.

In an exemplary embodiment, the operation characteristic of the main memory 120 is the number of transitions of a data strobe signal DQS exchanged between the host 110 and the main memory 120. The data strobe signal DQS is a type of a clock signal exchanged simultaneously with the exchange of the data between the host 110 and the main memory 120. For example, it is assumed that the number of transitions of the data strobe signal DQS exchanged between the host 110 and the main memory 120 is 10. Under the assumption, the bandwidth of the main memory 120 is calculated as 10 bps.

In an exemplary embodiment, the operation characteristic of the main memory 120 is a cache miss ratio. For example, it is assumed that the total memory access number of the host 110 for one second is 10. When the cache miss ratio is 40 percent, in contrast, an access ratio of the main memory 120 is 40 percent. Thus, the access number of the main memory 120 is 4 that is 40 percent of 10. Assuming that the burst length of the main memory 120 is 1, the number of data bits transmitted to the host 110 from the main memory 120 for one second is four. Thus, the operating bandwidth of the main memory 120 may be 4 bps.

At S126, the host 110 updates the previously counted value (Old) to the new counted value (New). The updated counted value (New) may represent peak bandwidth monitored until now. Thus, the host 110 may repeatedly monitor peak bandwidth of the main memory 120 that newly occurs.

Figure 6:
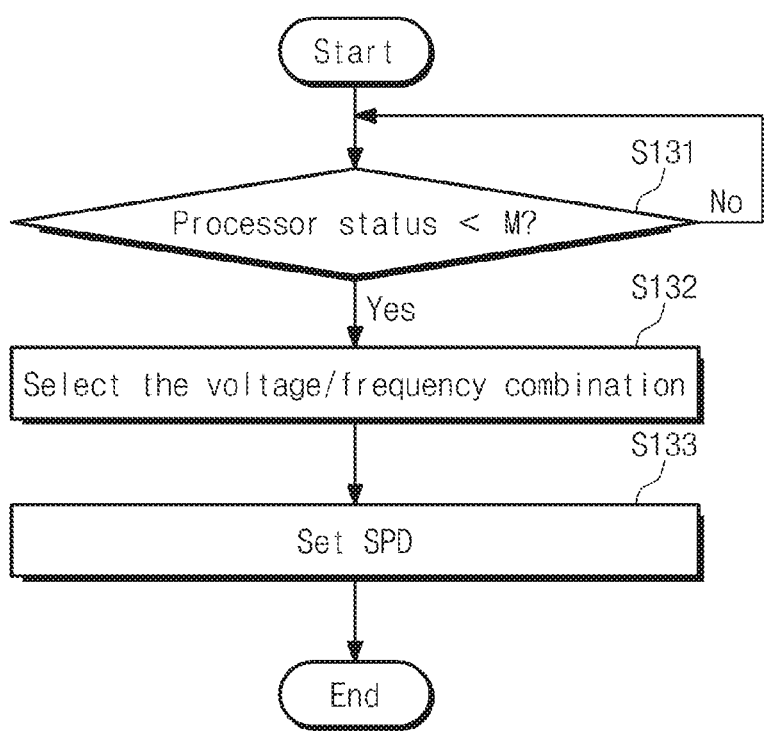
FIG. 6 is a flowchart illustrating a method that can be used to implement a S130 of FIG. 2 according to an exemplary embodiment of the inventive concept.

FIG. 6 is a flowchart illustrating a method of implementing S130 in FIG. 2 to set the SPD information in the SPD 121, according to an exemplary embodiment of the inventive concept.

At S131, a determination is made as to whether an operation characteristic of the host 110 is less than or equal to a specific value M. This is because S130 cannot be performed without completion of S120. When the operation characteristic of the host 110 is greater than the specific value M (No direction), the host 110 re-performs S131. However, when the operation characteristic of the host 110 is less than or equal to the specific value M (Yes direction), the host 110 performs the next step.

At S132, the host 110 determines the operating frequency and the operating voltage of the main memory 120 to cover the peak bandwidth of the main memory 120 that is monitored at S120. For example, it is assumed that the peak bandwidth monitored at S120 is 1800 Mbps. Under the assumption, the host 110 may select a Combination 3 where the main memory 120 sufficiently operates at 1800 Mbps, among the combinations in FIG. 4. The determined bandwidth of the main memory 120 may be 1866 Mbps, and the determined operating voltage of the main memory 120 may be 1.2 volt. For example, when the peak bandwidth is determined from the monitoring, it can be matched against operating frequencies listed in FIG. 4, and the one closest to the peak bandwidth can be selected to determine the corresponding operating voltage.

At S133, the host 110 transmits a combination of the operating frequency and the operating voltage of the main memory 120 determined at S132 to the SPD 121. The SPD 121 receives and stores the information.

At S140, the main memory 120 is rebooted under the operating frequency and the operating voltage set up at S130.

In an exemplary embodiment, the operation characteristic of the host 110 is a use ratio (e.g., a CPU use ratio). In an exemplary embodiment, when the operation characteristic of the host 110 is the use ratio, the specific value M compared at S131 is 80 percent.

At least one embodiment of the inventive concept is a method for calculating the peak bandwidth of the main memory 120 from the operation characteristic of the main memory 120. At least one embodiment of the inventive concept is a method for setting the operating frequency and the operating voltage of the main memory 120 from the peak bandwidth of the main memory 120.

Hereinafter, exemplary embodiments for using the number of commands and the number of data exchanges as operation characteristics of the main memory 120 will be described. The operation characteristics of the main memory 120 may be monitored through the exemplary embodiments.

Figure 7:
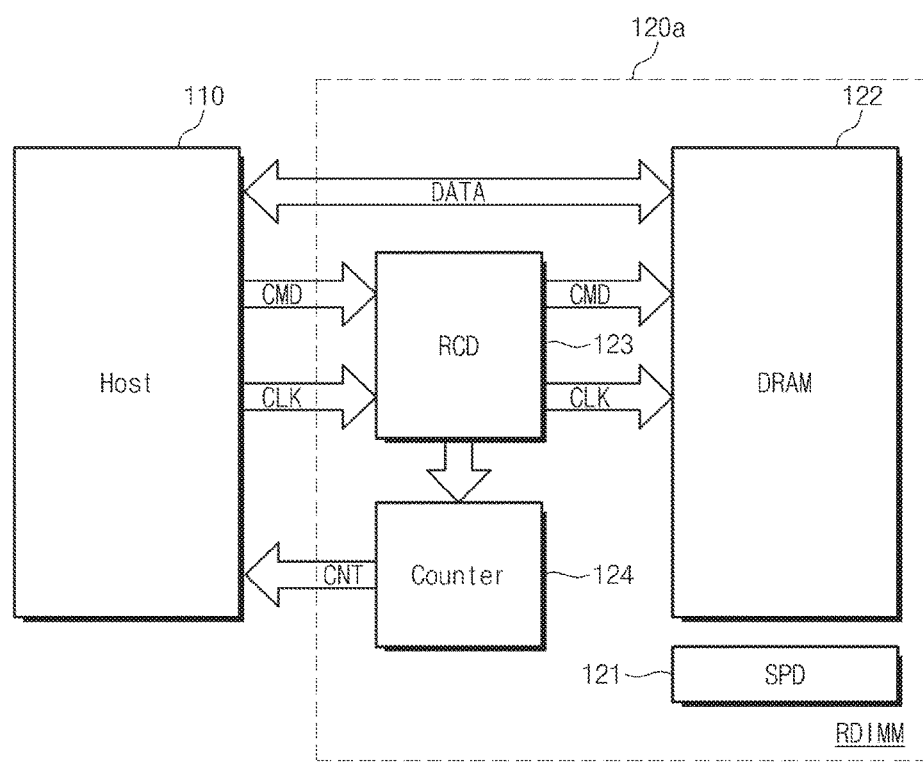
FIG. 7 is a block diagram illustrating a memory module in FIG. 1 according to an exemplary embodiment of the inventive concept.

FIG. 7 is a block diagram illustrating a device (e.g., a server) according to an exemplary embodiment of the inventive concept. The device includes a host 110 and a main memory 120a having a registered dual in-line memory module DIMM (RDIMM) structure. The main memory 120a having the RDIMM structure includes an SPD 121, a DRAM 122, a registering clock driver RCD 123, and a counter 124.

The SPD 121 may be connected to a host 110 and the DRAM 122. The DRAM 122 is connected to the RCD 123, the host 110, and the SPD 121. The RCD 123 is connected to the host 110 and the DRAM 122. In an embodiment, the RCD 123 performs as a buffer of a clock signal and a command transmitted to the DRAM 122 from the host 110 to reduce a load of an output unit of the host 110. The main memory 120 of FIG. 1 may be replaced with the main memory 120a of FIG. 7.

The host 110 accesses the main memory 120a. In this case, the host 110 directly exchanges data with the DRAM 122. Further, the host 110 provides a clock signal and a command to the DRAM 122 through the RCD 123. At this point, the host 110 provides an operation flag to the counter 124. In response to the operation flag, the counter 124 counts the number of commands of the RCD 123 that are input to the DRAM 122 to generate a counted value and provides the counted value to the host 110. The host 110 stores the counted value provided from the counter 124 in the register 112 of the host 110. The host 110 provides the counter 124 with a flag (e.g., a stop flag) to stop the operation of the counter 124 after the passage of a predetermined time. The counter 124 stops the operation in response to the stop flag. The host 110 calculates the operation bandwidth of the DRAM 122 from the stored counted value.

Figure 8:
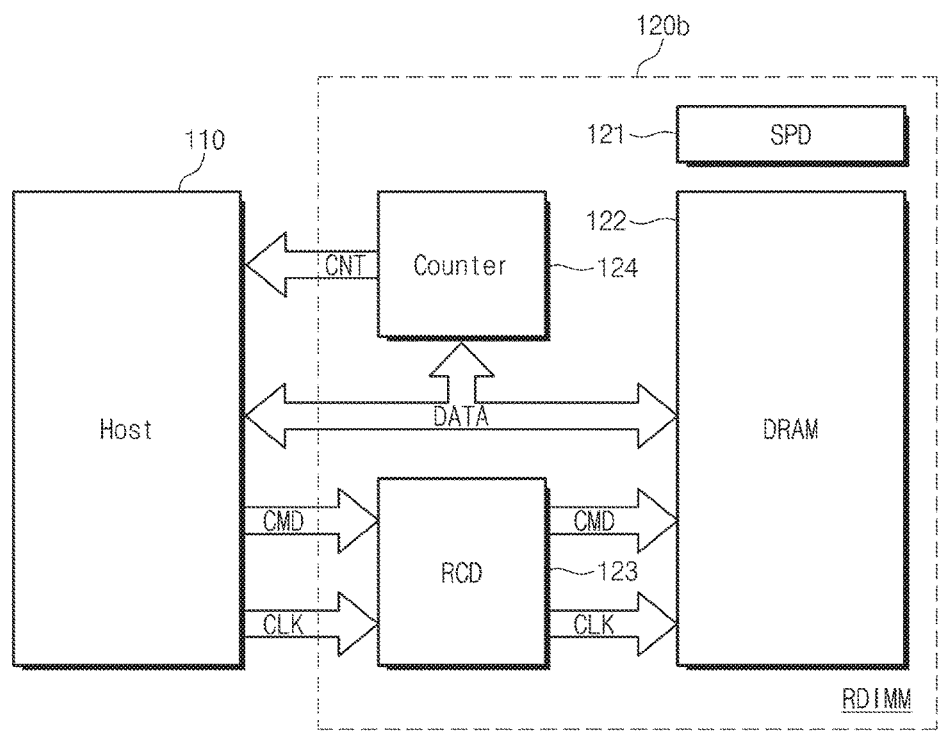
FIG. 8 is a block diagram illustrating a memory module in FIG. 1 according to an exemplary embodiment of the inventive concept.

FIG. 8 is a block diagram illustrating a device (e.g., a server) according to an exemplary embodiment of the inventive concept. A difference between a structure of a main memory 120b in FIG. 8 and the structure of the main memory 120a in FIG. 7 is a position of a counter 124. The main memory 120b includes an SPD 121, a DRAM 122, an RCD 123, and a counter 124. The counter 124 is connected to the host 110 and the DRAM 122. The main memory 120 of FIG. 1 may be replaced with the main memory 120b of FIG. 8.

Except for a difference in operation characteristic of the DRAM 122 that the counter 124 counts, the main memory 120b in FIG. 8 operates in the same way as the main memory 120a in FIG. 7. The host 110 accesses the DRAM 122. In response to an operation flag provided from the host 110, the counter 124 counts at least one of the number of data bits and the number of transitions of a data strobe signal DQS exchanged between the host 110 and the DRAM 122. Subsequent operations are identical to those described in FIG. 7 and will not be described in further detail.

Figure 9:
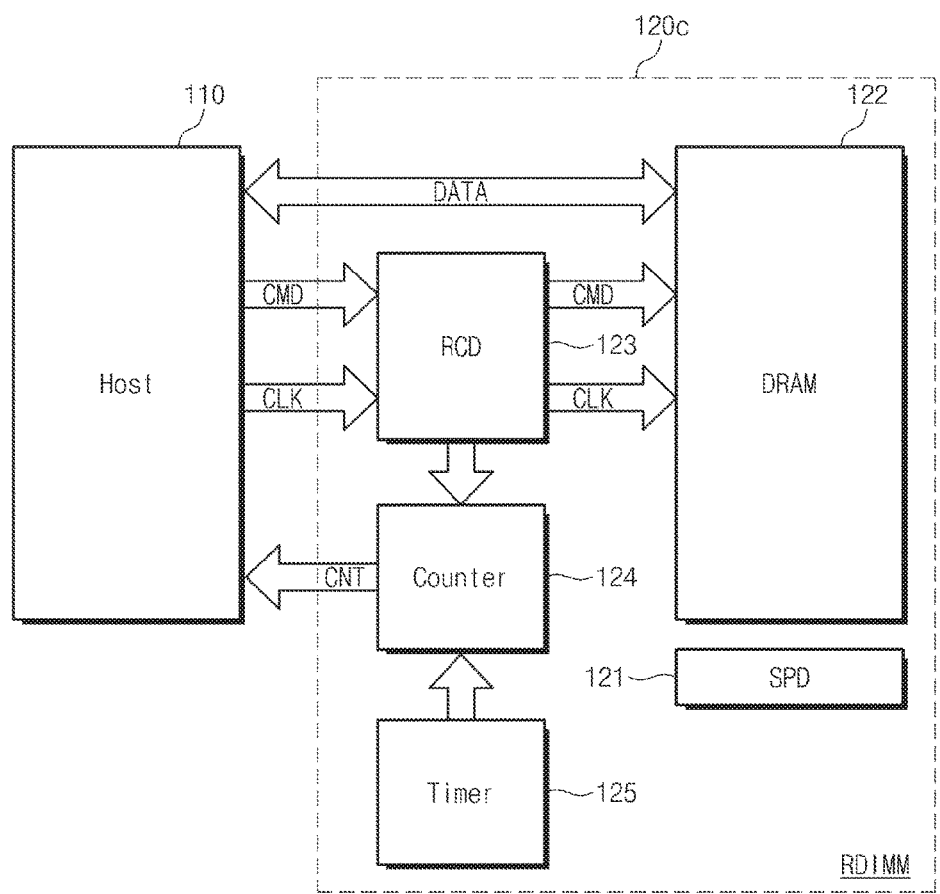
FIG. 9 is a block diagram illustrating a memory module in FIG. 1 according to an exemplary embodiment of the inventive concept.

FIG. 9 is a block diagram illustrating a device (e.g., a server) according to an exemplary embodiment of the inventive concept. A structure of a main memory 120c in FIG. 9 further includes a timer 125 mounted on the structure of the main memory 120a in FIG. 7. The main memory 120 of FIG. 1 may be replaced with the memory 120c of FIG. 9. The timer 125 is connected to a counter 124. The timer 125 may control the counter 124 so that the counter 124 operates for a reference time. In an embodiment, each time a given period larger than the reference time elapses, the counter 112 operates only for the reference time and is idle for the remainder of the period.

Except that the timer 125 provides a stop flag to the counter 124, the main memory 120c operates in the same way as the main memory 120a in FIG. 7. The host 110 accesses a DRAM 122. At this point, the host 110 provides an operation flag to the counter 124 and the timer 125. After the passage of a predetermined time, the timer 125 provides the counter 124 with a flag (e.g., the stop flag) to stop the operation of the counter 124. Subsequent operations are identical to those described in FIG. 7 and will not be described in further detail.

Figure 10:
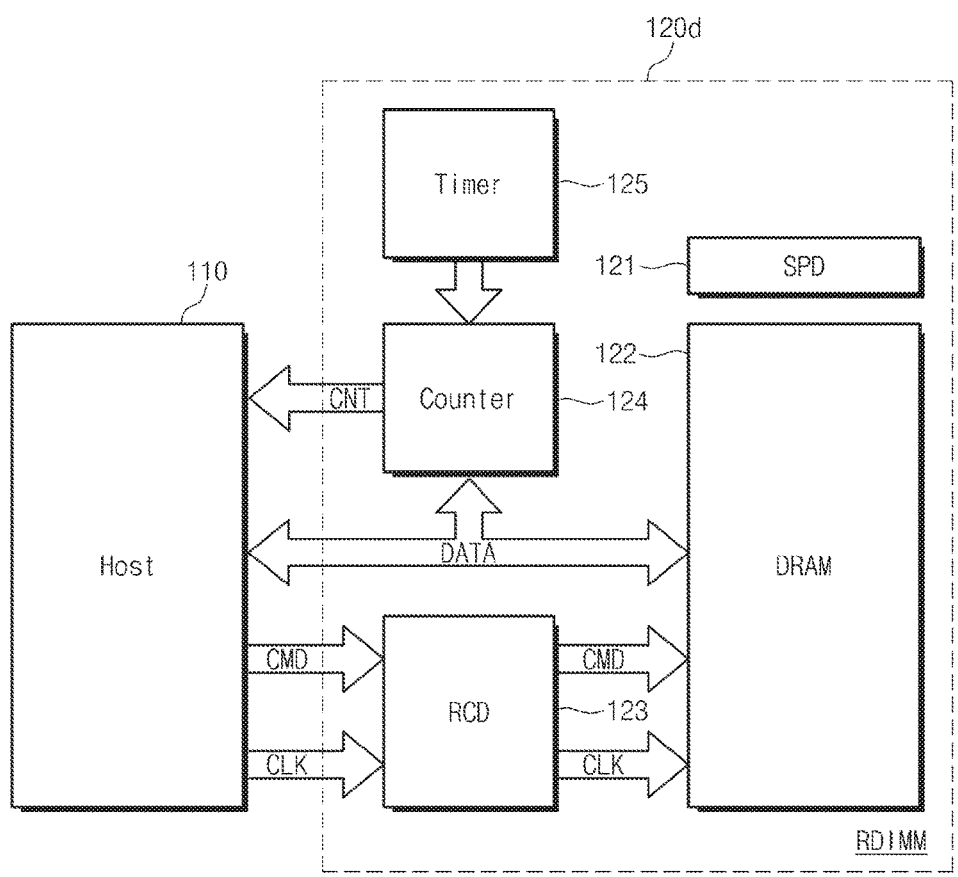
FIG. 10 is a block diagram illustrating a memory module in FIG. 1 according to an exemplary embodiment of the inventive concept.

FIG. 10 is a block diagram illustrating a device (e.g., a server) according to an exemplary embodiment of the inventive concept. A structure of a main memory 120d in FIG. 10 further includes a timer 125 mounted on the structure of the main memory 120b in FIG. 8. The timer 125 is connected to a counter 124. The memory 120 of FIG. 1 may be replaced with the memory 120d of FIG. 10.

Except that the timer 125 provides a stop flag to the counter 124, the main memory 120d operates in the same way as the main memory 120b in FIG. 8. The host 110 accesses a DRAM 122. At this point, the host 110 provides an operation flag to the counter 124 and the timer 125. After the passage of a predetermined time, the timer 125 provides the counter 124 with a flag to stop the operation of the counter 124. Subsequent operations are identical to those described in FIG. 8 and will not be described in further detail.

Figure 11:
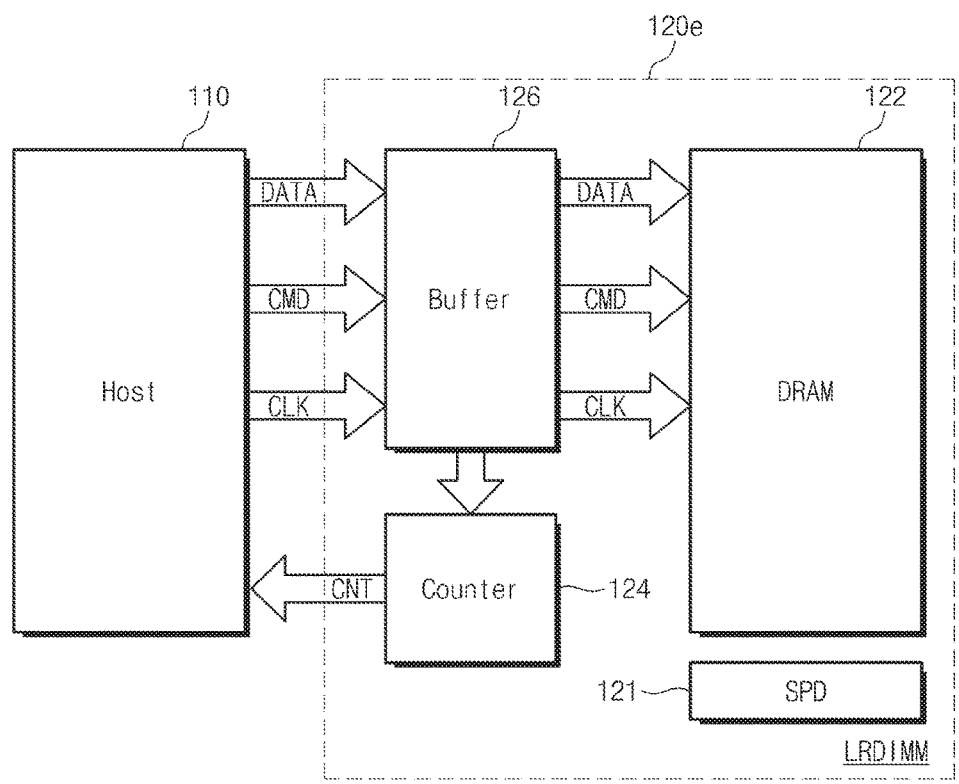
FIG. 11 is a block diagram illustrating a memory module in FIG. 1 according to an exemplary embodiment of the inventive concept.

FIG. 11 is a block diagram illustrating a device (e.g., a server) according to an exemplary embodiment of the inventive concept. In this embodiment, a main memory 120e has a load reduced DIMM (LRDIMM) structure. The main memory 120e includes an SPD 121, a DRAM 122, a counter 124, and a buffer 126. The main memory 120 of FIG. 1 may be replaced with the main memory 120e of FIG. 11.

The SPD 121 may be connected to a host 110 and the DRAM 122. The DRAM 122 may be connected to the SPD 121 and the buffer 126, and be indirectly connected to the host 110 through the buffer 126. The counter 124 is connected to the buffer 126 and the host 110. The buffer 126 is connected to the host 110 and the DRAM 122. The buffer 126 serves to reduce a load of an output unit of the host 110.

The host 110 accesses the main memory 120e. In this case, the host 110 indirectly exchanges data, a clock signal, and a command with the DRAM 122 through the buffer 126. The host 110 may send a data strobe signal DQS along with the data to the DRAM 112. At this point, the host 110 provides an operation flag to the counter 124. In response to the operation flag, the counter 124 counts at least one of the number of commands, the number of data bits exchanged between the host 110 and the DRAM 122, and the number of transitions of the data strobe signal DQS. The counter 124 may receive the data strobe signal DQS from the buffer 126 to count its transitions. Then, the counter 124 provides a counted value to the host 110. The host 110 stores the counted value provided from the counter 124 in a register 112 of the host 110. After the passage of a predetermined time, the host 110 provides the counter 124 with a stop flag to stop the operation of the counter 124. In response to the stop flag, the counter 124 stops operating. Then the host 110 calculates an operation bandwidth of the DRAM 122 from the stored counted value.

Figure 12:
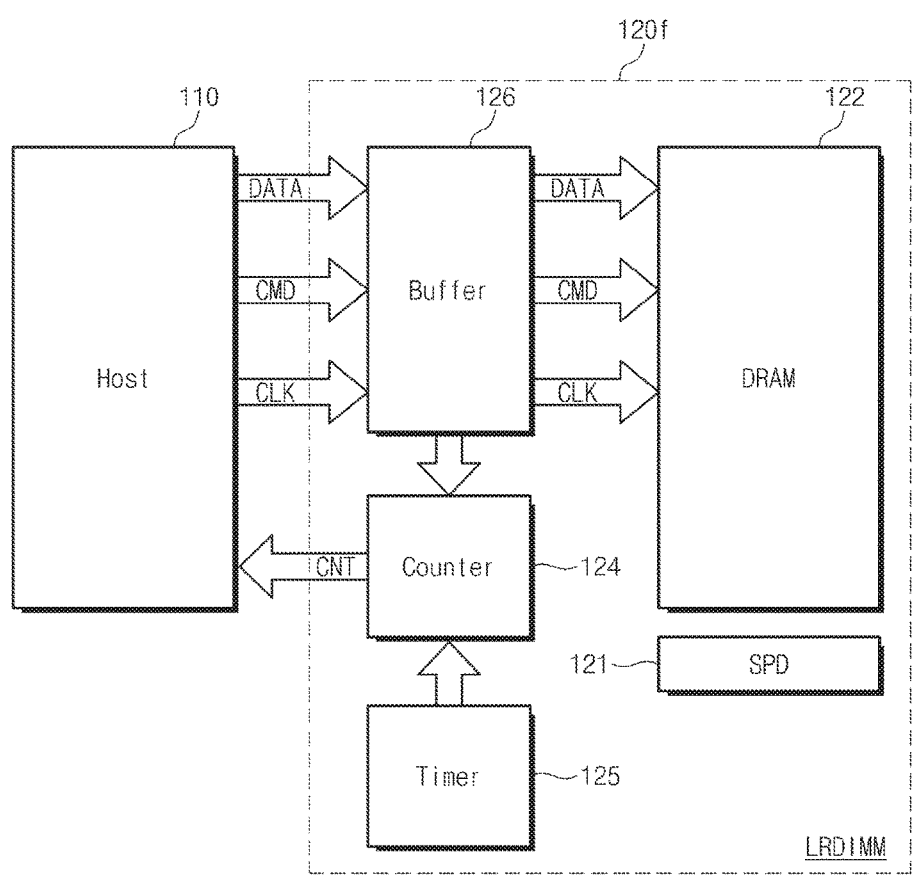
FIG. 12 is a block diagram illustrating a memory module in FIG. 1 according to exemplary embodiment of the inventive concept.

FIG. 12 is a block diagram illustrating a device (e.g., a server) according to an exemplary embodiment of the inventive concept. A structure of a main memory 120f in FIG. 12 further includes a timer 125 mounted on the structure of the main memory 120e in FIG. 11. The timer 125 is connected to a counter 124. The main memory 120 of FIG. 1 may be replaced with the main memory 120f of FIG. 12.

Except that the timer 125 provides a stop flag to the counter 124, the main memory 120f operates in the same way as the main memory 120e in FIG. 11. When a host 110 accesses a DRAM 122, the host 110 provides an operation flag to the counter 124 and the timer 125. After the passage of a predetermined time, the timer 125 provides the counter 124 with a flag to stop the operation of the counter 124. Subsequent operations are identical to those described in FIG. 11 and will not be described in further detail.

Figure 13:
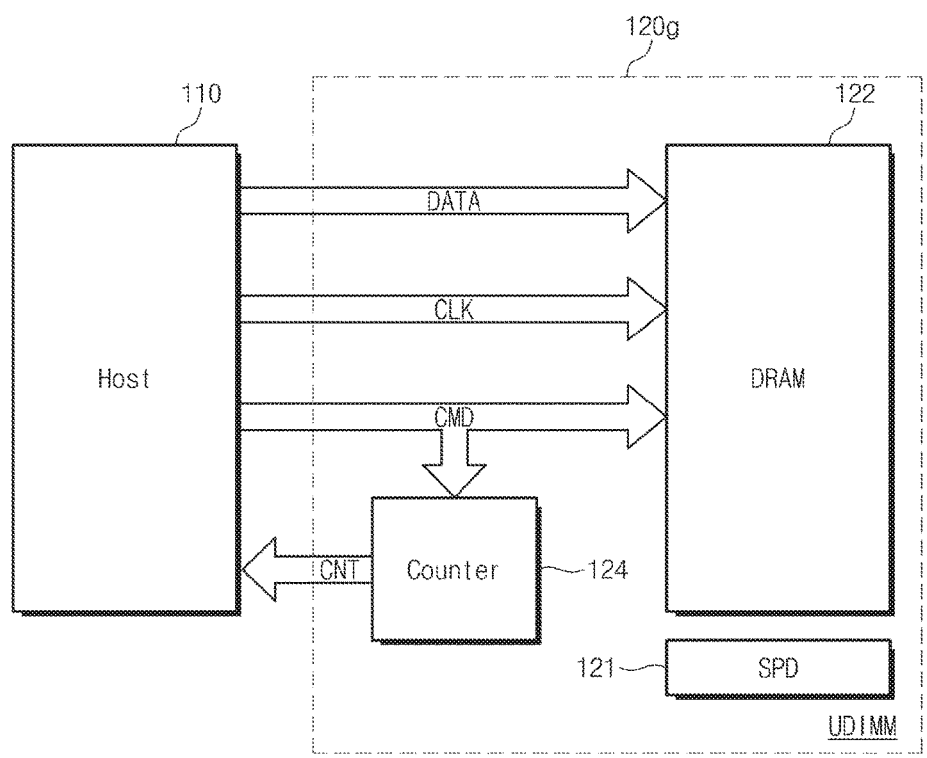
FIG. 13 is a block diagram illustrating a memory module in FIG. 1 according to an exemplary embodiment of the inventive concept.

FIG. 13 is a block diagram illustrating a device (e.g., a server) according to an exemplary embodiment of the inventive concept. The device includes a host 110 and a main memory 120g having an unbuffered DIMM (UDIMM) structure according to an exemplary embodiment of the inventive concept. The main memory 120g includes an SPD 121, a DRAM 122, and a counter 124. The SPD 121 may be connected to the host 110 and the DRAM 122. The DRAM 122 may be connected to the SPD 121. The DRAM 122 is connected to the host 110. The counter 124 is connected to the host 110 and the DRAM 122.

The host 110 accesses the main memory 120g. In this case, the host 110 directly exchanges data, a clock signal, and a command with the DRAM 122. At this point, the host 110 provides an operation flag to the counter 124. In response to the operation flag, the counter 124 counts the number of commands of the host 110 input to the DRAM 122 and provides a counted value to the host 110. The host 110 stores the counted value provided from the counter 124 in a register 112 of the host 110. After the passage of a predetermined time, the host 110 provides the counter 124 with a stop flag to stop the operation of the counter 124. In response to the stop flag, the counter 124 stops operating. Finally, the host 110 calculates an operation bandwidth of the DRAM 122 from the stored counted value.

Figure 14:
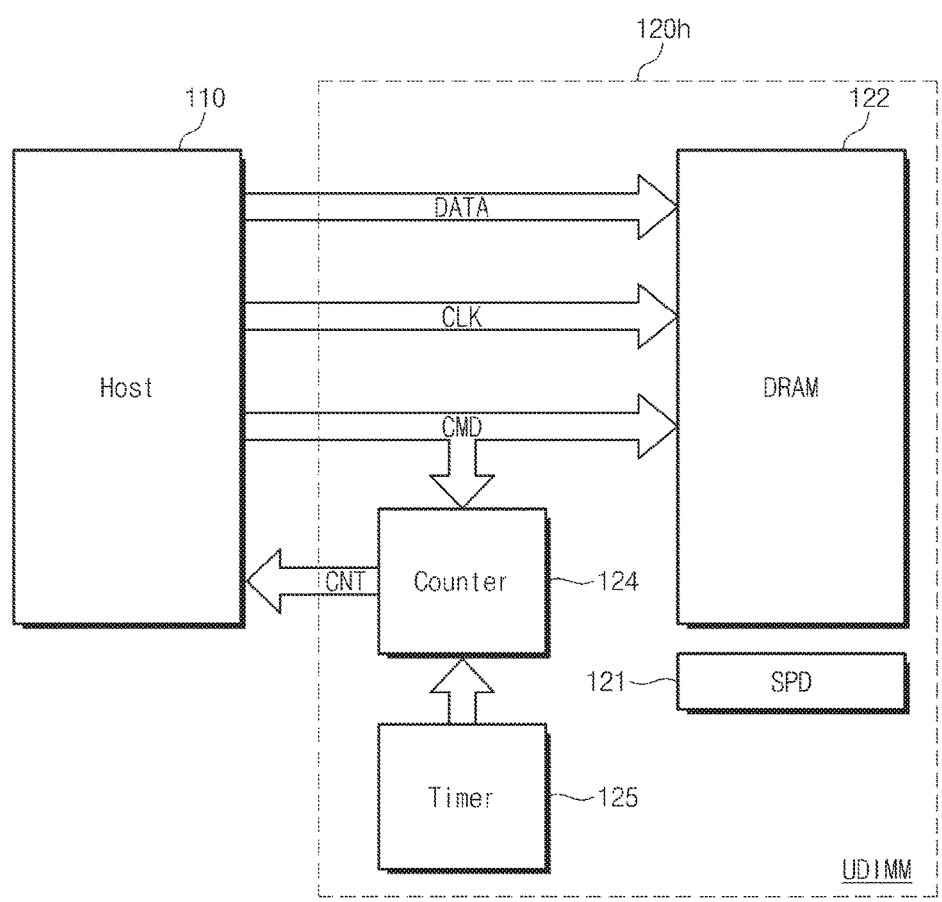
FIG. 14 is a block diagram illustrating a memory module in FIG. 1 according to an exemplary embodiment of the inventive concept.

FIG. 14 is a block diagram illustrating a device (e.g., a server) according to an exemplary embodiment of the inventive concept. The device includes a host 110 and a main memory 120h having a UDIMM structure. A structure of the main memory 120h further includes a timer 125 mounted on the structure of the main memory 120g in FIG. 13. The timer 125 may be connected to a counter 124. The main memory 120 of FIG. 1 may be replaced with the main memory 120h of FIG. 14.

Except that the timer 125 provides a stop flag to the counter 124, the main memory 120h operates in the same way as the main memory 120g in FIG. 13. The host 110 accesses a DRAM 122. At this point, the host 110 provides an operation flag to the counter 124 and the timer 125. After the passage of a predetermined time, the timer 125 provides the counter 124 with a stop flag to stop the operation of the counter 124. Subsequent operations are identical to those described in FIG. 13 and will not be described in further detail.

Figure 15:
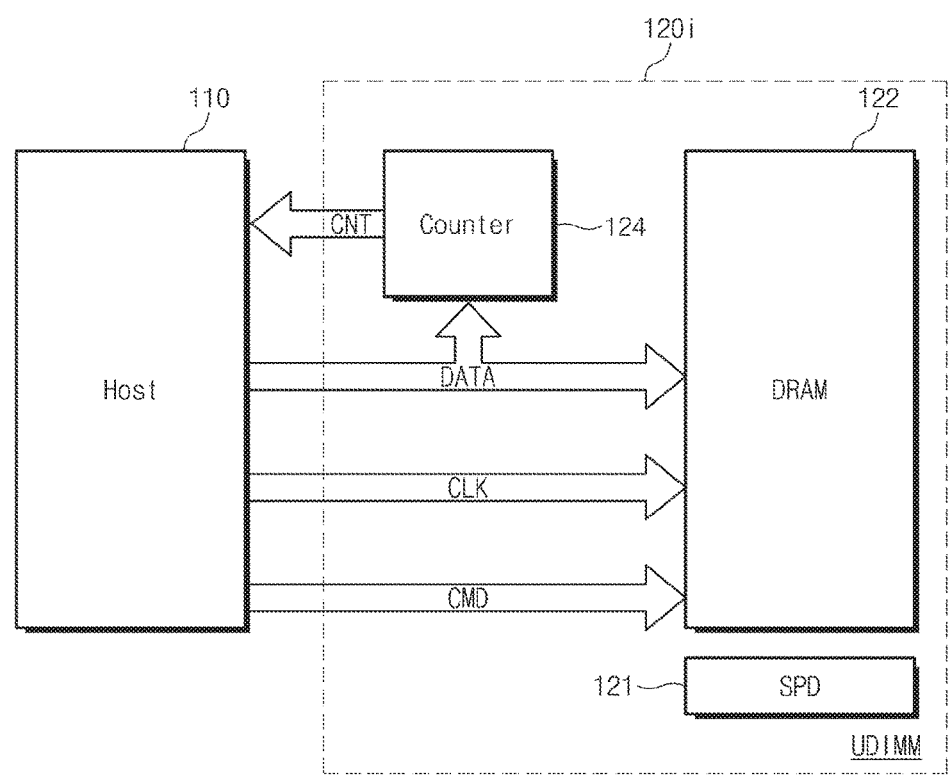
FIG. 15 is a block diagram illustrating a memory module in FIG. 1 according to an exemplary embodiment of the inventive concept.

FIG. 15 is a block diagram illustrating a device (e.g., a server) according to an exemplary embodiment of the inventive concept. The device includes a host 110 and a main memory 120i having a UDIMM structure. A difference between a structure of the main memory 120i in FIG. 15 and the structure of the main memory 120g in FIG. 13 is a position of a counter 124. In this embodiment, the counter 124 is connected to the host 110 and the DRAM 122. The main memory 120 of FIG. 1 may be replaced with the main memory 120i of FIG. 14.

Except for a difference in operation characteristic of the DRAM 122 that the counter 124 counts, the main memory 120i operates in the same way as the main memory 120g in FIG. 13. The host 110 accesses the DRAM 122. In response to an operation flag provided from the host 110, the counter 124 counts at least one of the number of data bits exchanged between the host 110 and the DRAM 122 and the number of transitions of a data strobe signal DQS. Subsequent operations are identical to those described in FIG. 13 and will not be described in further detail.

Figure 16:
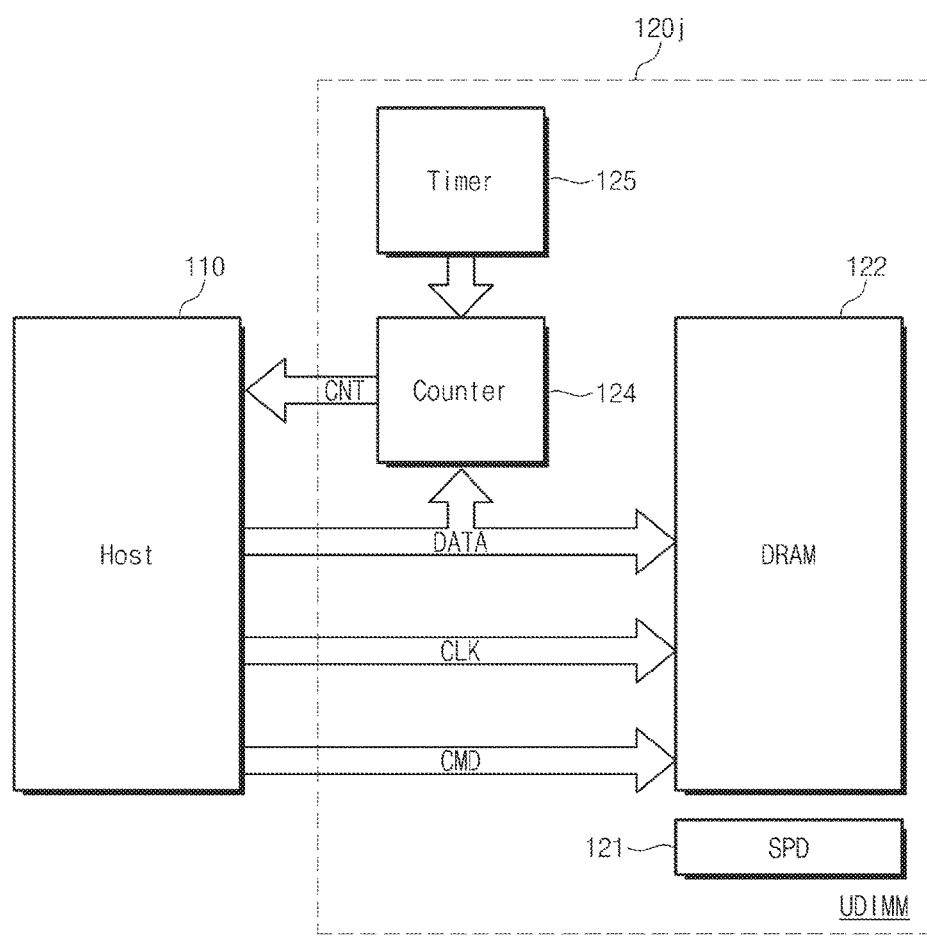
FIG. 16 is a block diagram illustrating a memory module in FIG. 1 according to an exemplary embodiment of the inventive concept.

FIG. 16 is a block diagram illustrating a device (e.g., a server) according to an exemplary embodiment of the inventive concept. The device includes a host 110 and a main memory 120j having a UDIMM structure. A structure of the main memory 120j further includes a timer 125 mounted on the structure of the main memory 120i in FIG. 15. The timer 125 is connected to a counter 124.

Except that the timer 125 provides a stop flag to a counter 124, the main memory 120j operates in the same way as the main memory 120i in FIG. 15. When a host 110 accesses a DRAM 122, the host 110 provides an operation flag to the counter 124 and the timer 125. After the passage of a predetermined time, the timer 125 provides the counter 124 with a stop flag to stop the operation of the counter 124. Subsequent operations are identical to those described in FIG. 15 and will not be described in further detail.

Figure 17:
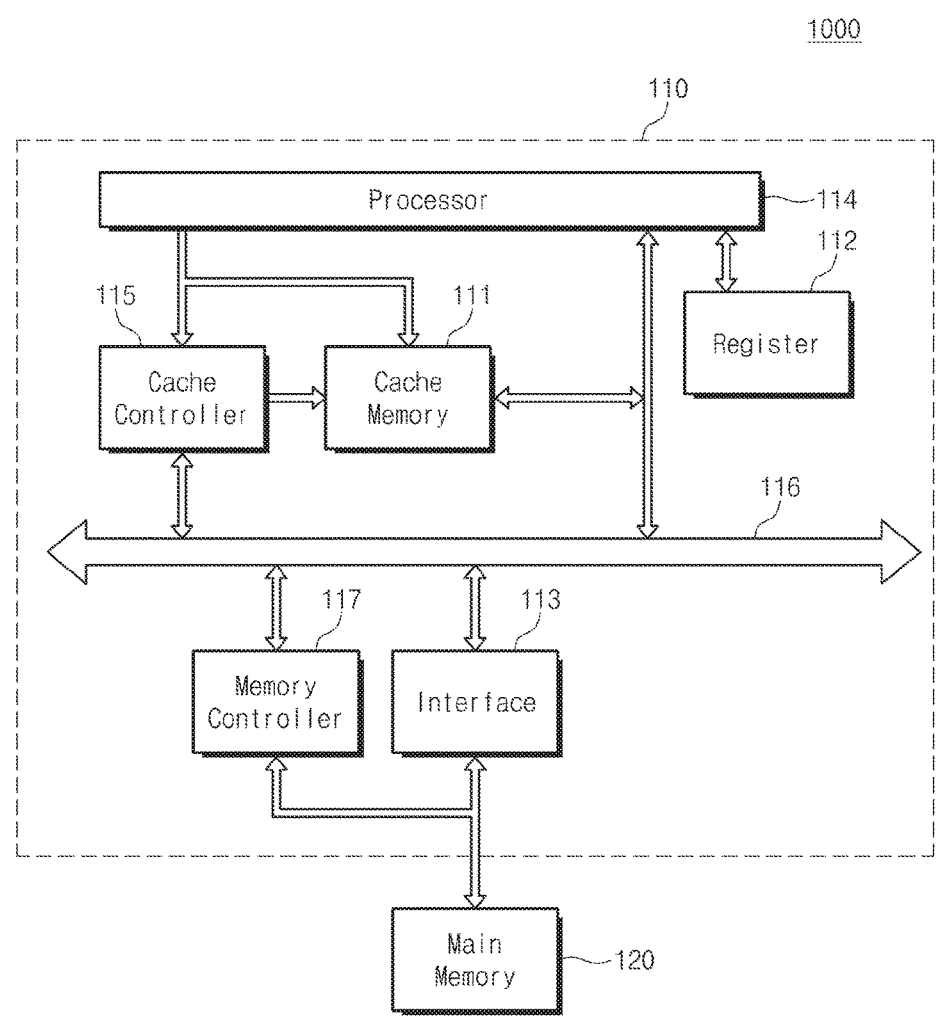
FIG. 17 is a block diagram illustrating an application example of the inventive concept.

FIG. 17 is a block diagram of a server system illustrating an application example of the inventive concept. As illustrated, the server system 1000 includes a cache memory 111, a register 112, an interface 113, a processor 114, a cache memory controller 115, a system bus 116, and a memory controller 117.

The processor 114 is connected to the cache controller 115 and the cache memory 111, and is connected to the main memory 120 through the system bus 116 and the interface 113.

The cache memory 111 is connected to the cache controller 115, and is connected to the main memory 120 through the system bus 116. In an exemplary embodiment, the cache memory 111 is one of L1, L2, and L3 caches.

The cache controller 115 receives a command from the processor 114 to control the cache memory 111. The memory controller 117 receives the command of the processor 114 through the data bus 116 to control the main memory 120. When the processor 114 accesses the main memory 120, the interface 113 exchanges data and a data strobe signal DQS with the main memory 120.

All the above-described embodiments of the inventive concepts may be applied to server computers.

As described above, a method for efficiently determining an operation status of a semiconductor memory and a method for managing memory power through the operation status may be provided. Thus, server management and memory use efficiencies may be improved and total cost ownership (TCO) of a data center may be reduced. Moreover, when memory maximum operation bandwidth is monitored using a buffer of an LRDIMM or a command counter of an RCD of an RDIMM, a signal may be generated in hardware. Thus, a reliable and high-speed operation may be performed.

While some exemplary embodiments have been particularly shown and described above, it will be understood by those of ordinary skill in the art that variations in form and detail may be made therein without departing from the spirit and scope of the inventive concept.

What is claimed is:

1. A memory module comprising:
a buffer configured to transmit at least one of a command and a clock signal transmitted from a host;
a counter configured to count a number of commands transmitted from the host to the buffer and provide a counted number to the host, the counter being connected to the buffer;
a memory device configured to receive the at least one of the command and the clock signal from the buffer and receive an operating frequency and an operating voltage from the host that are determined based on the counted number; and
a serial presence detect (SPD) configured to store the received operating frequency and operating voltage.

2. The memory module as set forth in claim 1, wherein the counter is further configured to count at least one of a number of data bits exchanged between the host and the memory device and a number of transitions of a data strobe signal to generate the counted number, and transmit the counted number to the host.

3. The memory module as set forth in claim 1, further comprising a timer configured to control the counter so that the counter operates for a reference time.

4. The memory module as set forth in claim 1,
wherein the counter is further configured to count at least one of the number of data bits transmitted to the buffer and the number of transitions of a data strobe signal, and provide the counted number to the host.

5. The memory module as set forth in claim 1, which is connected to the host in the form of a dual in-line memory module (DIMM).

6. A method of managing power of a main memory module comprising a memory device and a buffer configured to transmit at least one of a command and a clock signal to the memory device, comprising:
transmitting, by a host, an operation flag to the main memory module further comprising a counter counting a number of commands transmitted from the host to the buffer;
calculating, by the host, a peak bandwidth of the main memory module from an operation characteristic of the main memory module determined based on a counted number of the counter in synchronization with the operation flag or a cache miss ratio of a cache of the host;
determining, by the host, an operating frequency and an operating voltage of the main memory module so that the operating frequency of the main memory module is higher than the peak bandwidth; and
storing the determined operating frequency and the determined operating voltage in a serial presence detect (SPD) of the main memory module.

7. The method as set forth in claim 6, wherein determining, by the host, the operating frequency and the operating voltage of the main memory module comprises:
receiving SPD information of the main memory module;
setting the operating frequency and the operating voltage of the main memory module according to the SPD information;
comparing output quality of the main memory module with a reference quality;
changing the operating frequency and the operating voltage of the main memory module depending on a result of the comparison; and
storing the changed operating frequency and the changed operating voltage in a register.

8. The method as set forth in claim 6, wherein the operation flag is generated when a central processing unit (CPU) use rate of the host is greater than or equal to a specific value.

9. The method as set forth in claim 6, wherein the operation characteristic of the main memory module is the number of commands counted for a reference time.

10. The method as set forth in claim 6, wherein the operation characteristic of the main memory module is at least one of a number of data bits counted for a reference time and a number of transitions of a data strobe signal.

11. The method as set forth in claim 6, further comprising rebooting the main memory module under a condition of the determined operating frequency and the determined operating voltage.

12. A server comprising:
a host computer comprising a cache and a register storing a plurality of entries, wherein each entry includes a different operating frequency and an operating voltage pair; and
a main memory module comprising a memory device, a buffer configured to transmit at least one of a command and a clock signal to the memory device, a counter counting a number of commands transmitted from the host to the buffer, and a serial presence detect (SPD),
wherein the counter is connected to the buffer and is configured to transmit a counted number to the host computer, and
wherein the host computer determines a memory bandwidth of the main memory based on the counted number of the counter or a cache miss ratio of the cache, selects one of the entries that corresponds to the determined memory bandwidth, and transmits the operating frequency and the operating voltage of the selected one entry to the SPD.

13. The server of claim 12, wherein the host computer determines the memory bandwidth based on a number data bits exchanged between the host computer and the main memory during a given period.

14. The server of claim 12, wherein the host computer determines the memory bandwidth based on a central processing unit (CPU) use rate of a CPU of the host computer.

15. The server of claim 12, wherein the host computer reboots the main memory after transmitting the operating frequency and the operating voltage of the selected one entry to the SPD.

* * * * *